United States Patent
Katsuyama et al.

(10) Patent No.: US 8,637,338 B2
(45) Date of Patent: Jan. 28, 2014

(54) METHOD FOR PRODUCING INTEGRATED OPTICAL DEVICE

(71) Applicant: Sumitomo Electric Industries, Ltd., Osaka (JP)

(72) Inventors: Tomokazu Katsuyama, Yokohama (JP); Kenji Hiratsuka, Kamakura (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 13/740,616

(22) Filed: Jan. 14, 2013

(65) Prior Publication Data

US 2013/0183784 A1    Jul. 18, 2013

(30) Foreign Application Priority Data

Jan. 18, 2012    (JP) .................................. 2012-008032

(51) Int. Cl.
*H01L 33/00*    (2010.01)
(52) U.S. Cl.
USPC .......................... 438/47; 257/436; 372/45.01
(58) Field of Classification Search
USPC ..................... 438/47; 257/436; 372/50, 45.01
See application file for complete search history.

(56) References Cited

U.S. PATENT DOCUMENTS

| | | | | |
|---|---|---|---|---|
| 4,791,647 A | * | 12/1988 | Sugou | 372/45.01 |
| 5,220,573 A | * | 6/1993 | Sakata et al. | 372/50.21 |
| 5,335,241 A | * | 8/1994 | Okumura et al. | 372/46.01 |
| 2003/0067953 A1 | * | 4/2003 | Kim et al. | 372/43 |
| 2004/0179569 A1 | * | 9/2004 | Sato et al. | 372/50 |
| 2006/0039437 A1 | * | 2/2006 | Albrecht et al. | 372/70 |
| 2007/0223857 A1 | * | 9/2007 | Nunoya et al. | 385/14 |
| 2009/0129418 A1 | * | 5/2009 | Matsumura | 372/44.01 |

FOREIGN PATENT DOCUMENTS

| | | |
|---|---|---|
| JP | 2002-243964 | 8/2002 |
| JP | 2005-55764 | 3/2005 |
| JP | 2010-283104 | 12/2010 |

* cited by examiner

*Primary Examiner* — Alexander Ghyka
*Assistant Examiner* — Stanetta Isaac
(74) *Attorney, Agent, or Firm* — Smith, Gambrell & Russell, LLP

(57) ABSTRACT

A method for producing an integrated optical device includes the steps of growing, on a substrate including first and second regions, a first stacked semiconductor layer, a first cladding layer, and a side-etching layer; etching the first stacked semiconductor layer through a first etching mask formed on the first region; selectively growing, on the second region, a second stacked semiconductor layer and a second cladding layer; growing a third cladding layer and a contact layer on the first and second stacked semiconductor layers; and forming a ridge structure. The step of etching the first stacked semiconductor layer includes a step of forming an overhang between the first cladding layer and the first etching mask. The step of forming a ridge structure includes first, second, and third wet-etching steps in which the third cladding layer, the side-etching layer and the first and second cladding layers are selectively etched, respectively.

5 Claims, 17 Drawing Sheets

METHOD FOR PRODUCING INTEGRATED OPTICAL DEVICE

BACKGROUND OF THE INVENTION

1. Field of the Invention

The present invention relates to a method for producing an integrated optical device.

2. Description of the Related Art

Patent Reference 1 (Japanese Unexamined Patent Application Publication No. 2005-55764) and Patent Reference 2 (Japanese Unexamined Patent Application Publication No. 2002-243964) describe a method for producing an integrated optical device having a butt-joint structure. In the method describing in Patent Reference 1, a first waveguide having a stacked semiconductor layer including an InGaAsP active layer and a p-type InP cladding layer grown on an InP substrate is formed. Then, a second waveguide having a stacked semiconductor layer including an InGaAsP core layer and a p-type InP cladding layer is formed adjacent to the first waveguide on the InP substrate. Before forming the second waveguide, the InGaAsP active layer and p-type InP cladding layer of the first waveguide is etched by wet etching through an etching mask. In this wet etching, a recess is formed under the etching mask. By forming the recess, a rising of the InGaAsP core layer and p-type cladding layer is suppressed at growing the second waveguide.

In the method describing in Patent Reference 2, a first lower guiding layer, an active layer, a first upper guiding layer, and a first upper cladding layer are sequentially grown on an InP substrate. The first lower guiding layer, the active layer, and the first upper guiding layer constitute a first waveguide layer. Then, an etching mask is formed on the first upper cladding layer. Portions of the first upper cladding layer, the first upper guiding layer, and the active layer are removed by dry etching through the etching mask. After this dry-etching process, the first waveguide layer is etched by wet etching through the etching mask. At this time, a side surface of the first waveguide layer undergoes side etching. On the InP substrate having been exposed by the wet etching, a second waveguide layer and a second upper cladding layer are sequentially grown. Thus, the butt-joint coupling between the first waveguide layer and the second waveguide layer is achieved.

SUMMARY OF THE INVENTION

FIGS. 14A to 16B illustrate an example of a method for producing an integrated optical device having a butt-joint structure. The integrated optical device is produced in the following manner. Referring to FIG. 14A, a lower cladding layer 112, a waveguiding layer 114, an upper cladding layer 116, and a side-etching layer 117 are grown on a semiconductor substrate 102. The lower and upper cladding layers 112 and 116 are made of InP. The lower cladding layer 112, the waveguiding layer 114, the upper cladding layer 116, and the side-etching layer 117 constitute a first stacked semiconductor layer. The side-etching layer 117 is etched faster than the upper cladding layer 116 and hence can be selectively etched. The side-etching layer 117 is formed of, for example, InGaAsP. Subsequently, referring to FIG. 14B, a mask 118 for covering a portion that is to be a first stacked semiconductor layer 110 is formed. A portion other than the first stacked semiconductor layer 110 is then removed by etching through the mask 118. At this time, the side-etching layer 117 is selectively etched by wet etching to form an overhang between the mask 118 and the upper cladding layer 116. After that, portions of the upper cladding layer 116, the waveguiding layer 114, and the lower cladding layer 112 are removed by etching.

Referring to FIG. 14C, a lower cladding layer 122, a waveguiding layer 124, and an upper cladding layer 126 are selectively grown on the semiconductor substrate 102 through the mask 118. The lower cladding layer 122, the waveguiding layer 124, and the upper cladding layer 126 constitute a second stacked semiconductor layer 120. The lower and upper cladding layers 122 and 126 are made of InP. At this time, the overhang formed between the mask 118 and the upper cladding layer 116 suppresses abnormal growth of the upper cladding layer 126. In addition, the upper cladding layer 126 is formed so as to have a substantially flat surface.

The mask 118 is then removed. Referring to FIG. 15A, a cladding layer 130 and a contact layer 132 are subsequently grown over the side-etching layer 117 and the upper cladding layer 126. The cladding layer 130 is made of InP. After that, referring to FIG. 15B, a stripe-shaped mask 134 is formed on the contact layer 132. The contact layer 132, the cladding layer 130, and the upper cladding layers 116 and 126 are then etched through the mask 134. As a result of the above-described steps, a ridge structure 140 illustrated in FIG. 16A is formed.

However, in this production method, the following problem is caused during the formation of the ridge structure 140. FIG. 16B illustrates a section taken along line VI-VI in FIG. 16A. That is, FIG. 16B illustrates a section perpendicular to the longitudinal direction of the ridge structure 140. In order to form the ridge structure 140, the contact layer 132, the cladding layer 130, and the upper cladding layers 116 (126) are etched by wet etching. As a result of this etching, the ridge structure 140 can be formed such that its side surfaces have a specific crystal plane (for example, the (111) plane of an InP crystal). The ridge structure 140 may be formed such that the section thereof has a reverse-mesa structure. When the side-etching layer 117 is present between the upper cladding layer 116 and the cladding layer 130, as illustrated in FIG. 16B, stepped structures (portions B in FIG. 16B) are formed due to difference in etching rates for the side-etching layer 117, the upper cladding layer 116, and the cladding layer 130. Due to the stepped structures formed at the side surfaces of the ridge structure 140, a resistance of the device increases and an optical waveguide mode is disturbed. Furthermore, it is difficult to form a protective film (passivation film) on the side surfaces of the ridge structure 140 because the stepped structures are formed.

A method for producing an integrated optical device according to the present invention includes the steps of preparing a substrate including first and second regions arranged in a predetermined direction; growing, on the first and second regions of the substrate, a first stacked semiconductor layer including a first optical waveguiding layer, a first cladding layer positioned on the first optical waveguiding layer, and a side-etching layer positioned on the first cladding layer, the side-etching layer having a composition different from a composition of the first cladding layer; etching the first stacked semiconductor layer through a first etching mask formed on the first region until the first optical waveguiding layer is exposed; selectively growing, on the second region through the first etching mask, a second stacked semiconductor layer including a second optical waveguiding layer and a second cladding layer positioned on the second optical waveguiding layer, the second optical waveguiding layer being optically coupled to the first optical waveguiding layer; growing a third cladding layer and a contact layer on the first and second stacked semiconductor layers, and forming a ridge structure by etching the contact layer, the third cladding layer, the side-etching layer, and the first and second cladding layers through a second etching mask formed on the contact layer, the second etching mask longitudinally extending in the predetermined direction. The step of etching the first stacked semiconductor layer includes a step of forming an overhang between the first cladding layer and the first etching mask by selectively etching the side-etching layer by wet etching with an etchant having a higher etching rate for the side-etching layer than for the first cladding layer. In addition, the step of forming a ridge structure includes a first wet-etching step of etching the third cladding layer by wet etching with an etchant having a higher etching rate for the third cladding layer than for the side-etching layer, a second wet-etching step of etching the side-etching layer by wet etching with an etchant having a higher etching rate for the side-etching layer than for the first, second, and third cladding layers, and a third wet-etching step of etching the first and second cladding layers by wet etching with an etchant having a higher etching rate for the first and second cladding layers than for the side-etching layer.

In the above-described method for producing an integrated optical device, after growing a first stacked semiconductor layer, a second stacked semiconductor layer, a third cladding layer and a contact layer, the ridge structure is formed. In addition, in the step of growing a first stacked semiconductor layer, the side-etching layer is grown. In the step of etching the first stacked semiconductor layer, the overhang is formed by selectively etching the side-etching layer. Furthermore, the step of forming the ridge structure includes the first, second, and third wet-etching steps. In the first wet-etching step, the third cladding layer is selectively etched to form side surfaces of the third cladding layer. Then, in the second wet-etching step, the side-etching layer is selectively etched to form side surfaces of the side-etching layer. In the third wet-etching step, the first and second cladding layers are selectively etched to form side surfaces of the first and second cladding layers. Therefore, the width of the side-etching layer (width of the ridge structure in a direction perpendicular to the longitudinal direction) is narrowed in the second wet-etching step. As a result, formation of the stepped structure in the side surfaces of the ridge structure is avoided. Accordingly, the increase of the resistance of the device and the disturbance in the optical waveguide mode are suppressed. In addition, the protective film (passivation film) is properly formed on the side surfaces of the ridge structure.

In the method for producing an integrated optical device, the first, second, and third cladding layers are preferably formed of InP. The side-etching layer is preferably formed of InGaAsP. The etchants used in the step of forming the overhang and in the second wet-etching step are preferably an etchant containing sulfuric acid and hydrogen peroxide. In addition, the etchants in the first and third wet-etching step are preferably an etchant containing hydrogen bromide. Such a combination of semiconductor materials and etchants can suitably provide the above-described advantages of the method for producing an integrated optical device.

In the method for producing an integrated optical device, in the first and third wet-etching steps, the first, second, and third cladding layers may have side faces containing a (111) plane. In this case, the side surfaces constitute a reverse mesa structure with respect to the main surface of the substrate. Therefore, the above-described advantages of the method for producing an integrated optical device are preferably obtained.

The method for producing an integrated optical device, in the step of selectively growing a second stacked semiconductor layer, the second stacked semiconductor layer may further include a semiconductor layer formed on the second cladding layer, the semiconductor layer having the same composition as the side-etching layer. In addition, in the first wet-etching step, the wet etching for the third cladding layer may be stopped when the side-etching layer and the semiconductor layer are exposed.

In the method for producing an integrated optical device, the step of forming a ridge structure may further include, before the step of etching the first stacked semiconductor layer, a step of etching the contact layer by dry etching. As a result of etching the contact layer by dry etching, side surfaces of the contact layer are formed so as to be substantially perpendicular to the main surface of the substrate. In addition, the width of the contact layer is precisely controlled. The width of the third cladding layer is defined by the width of the contact layer in the first wet-etching step. Therefore, the width of the third cladding layer is also controlled precisely.

DESCRIPTION OF THE PREFERRED EMBODIMENTS

Hereinafter, methods for producing an integrated optical device according to embodiments of the present invention will be described in detail with reference to attached drawings. In descriptions of the drawings, like reference signs are used to denote like elements and redundant descriptions are omitted.

In the production methods described below, semiconductor layers are suitably formed by, for example, a metal-organic vapor phase epitaxy (MOVPE) method. Suitable examples of an n-type dopant include Sn and Si. Suitable examples of a p-type dopant include Zn. Values in parentheses representing the thicknesses of semiconductor layers are mere examples. If necessary, the thicknesses of semiconductor layers can be increased or decreased.

First Embodiment

Figure 1:
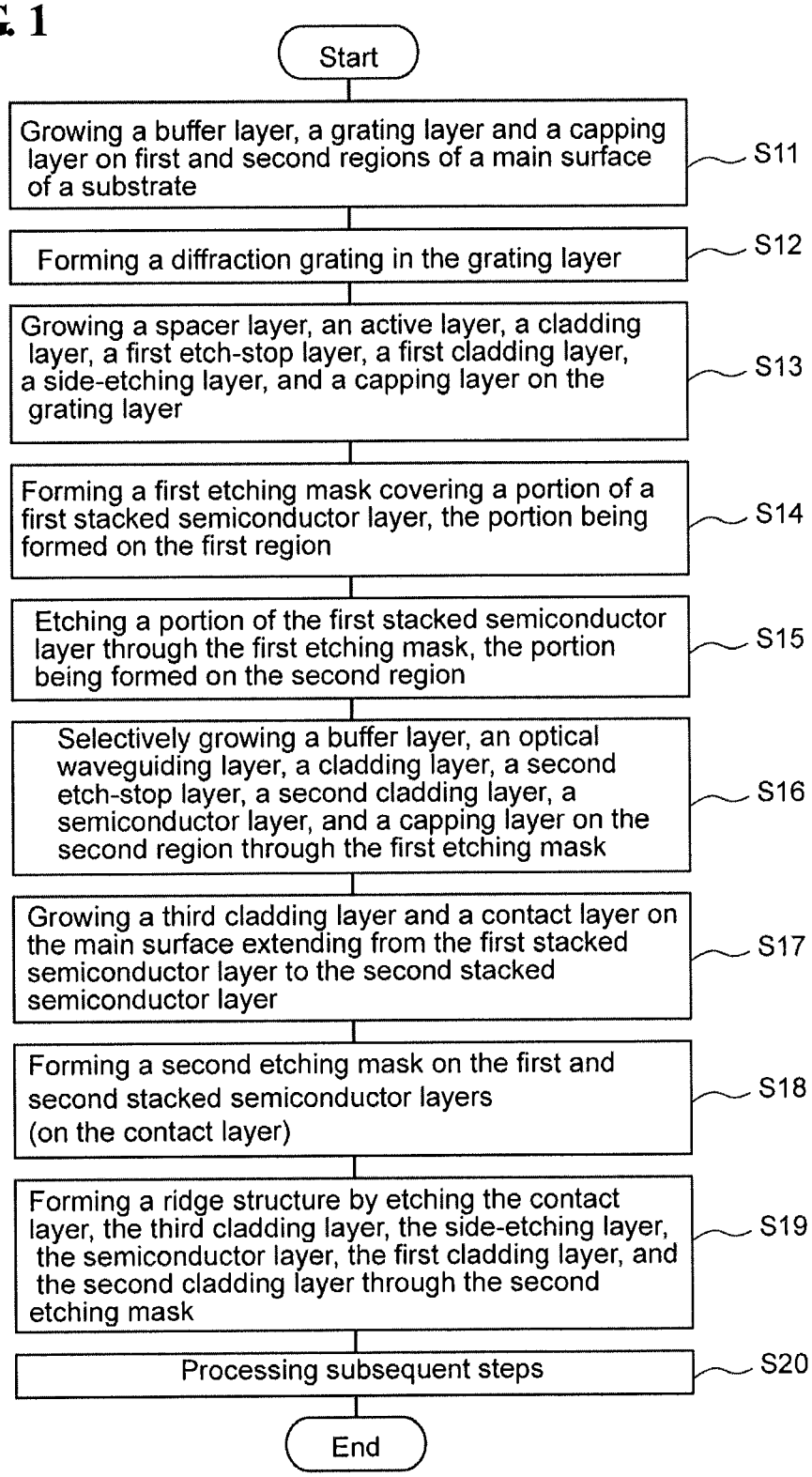
FIG. 1 is a flow chart of a method for producing an integrated optical device according to a first embodiment of the present invention.

FIG. 1 is a flow chart of a method for producing an integrated optical device according to a first embodiment of the present invention. FIGS. 2A to 13B are perspective views and sectional views illustrating the steps in FIG. 1.

<First Growth Step>

Figure 2A:
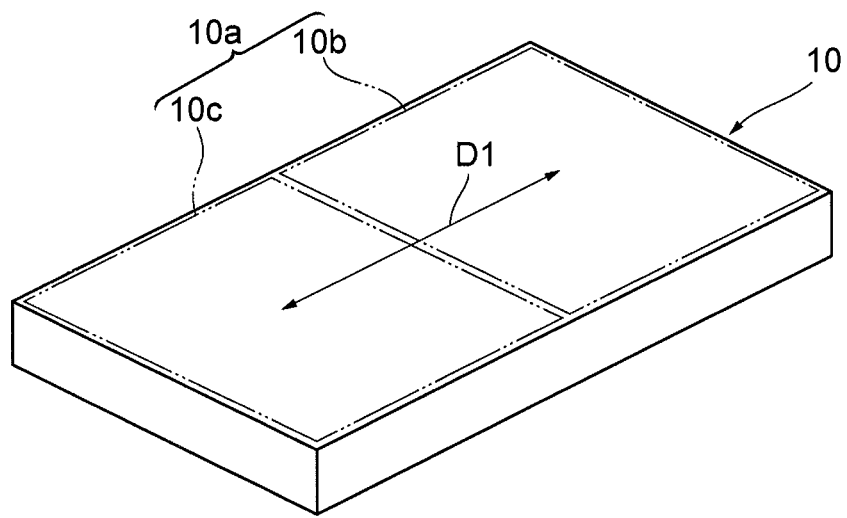
FIGS. 2A and 2B illustrate a first growth step.

In this production method, referring to FIG. 2A, an n-type InP substrate 10 having a main surface 10a is prepared. The n-type InP substrate 10 serves as a semiconductor substrate in the first embodiment. The main surface 10a of the n-type InP substrate 10 includes a first region 10b and a second region 10c that are arranged in a predetermined direction (arrow D1 in FIG. 2A). The predetermined direction is a waveguiding direction in the integrated optical device in the embodiment. The main surface 10a mainly includes the (001) plane of the crystalline InP substrate. The predetermined direction D1 preferably corresponds to the <110> direction of the InP substrate.

Figure 2B:
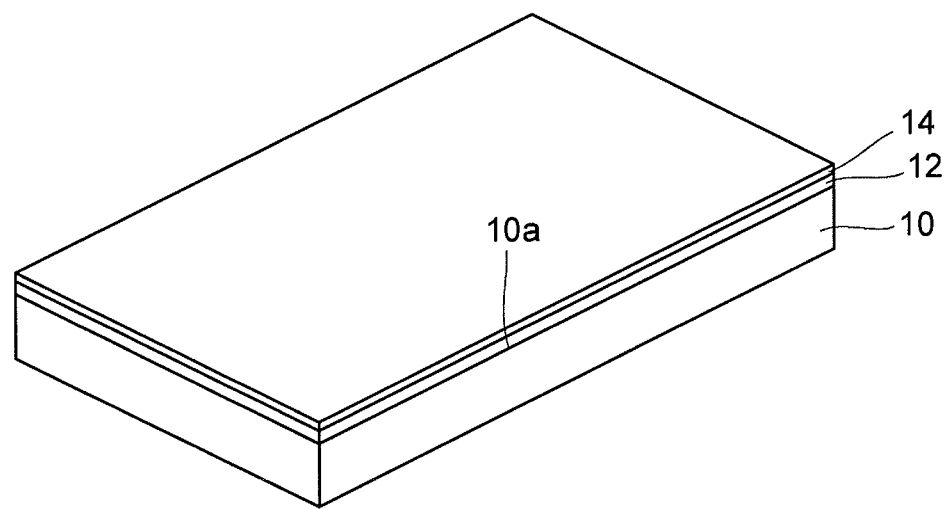

Referring to FIG. 2B, on the main surface 10a (first region 10b and second region 10c) of the n-type InP substrate 10, a buffer layer 12 (thickness: 500 nm), a grating layer 14 (thickness: 80 nm), and a capping layer (thickness: 10 nm; not shown) are then grown in this order (step S11 in FIG. 1). The buffer layer 12 and the capping layer are formed of, for example, n-type InP. The grating layer 14 is formed of a material having a higher refractive index than the buffer layer 12 and the capping layer. The grating layer 14 is formed of, for example, n-type InGaAsP. The grating layer 14 has a bandgap wavelength of, for example, 1330 nm. Here, the bandgap wavelength is related to the bandgap energy of a semiconductor material. Furthermore, the bandgap energy Eg (eV) and the bandgap wavelength λg (μm) have the relationship of λg=1.24/Eg. The n-type InP substrate 10, the buffer layer 12, the grating layer 14, and the capping layer have an impurity concentration of, for example, $5 \times 10^{17}$ cm$^{-3}$.

An etching mask is then formed on the grating layer 14 by an interference exposure method. After that, the grating layer 14 is etched through this etching mask (preferably by a dry etching process). As a result, referring to FIG. 3A, a diffraction grating is formed in the grating layer 14 (step S12 in FIG. 1).

Figure 3A:
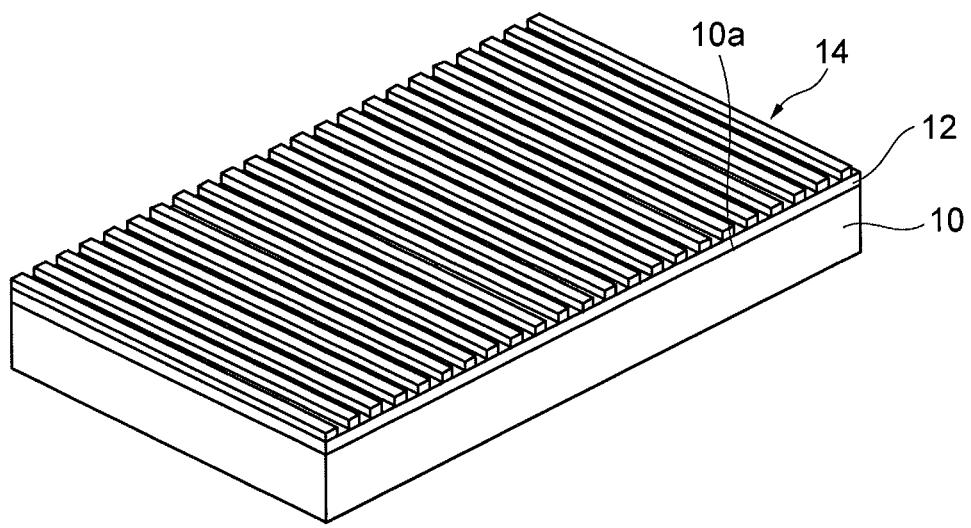
FIGS. 3A and 3B illustrate a first growth step.
Figure 3B:
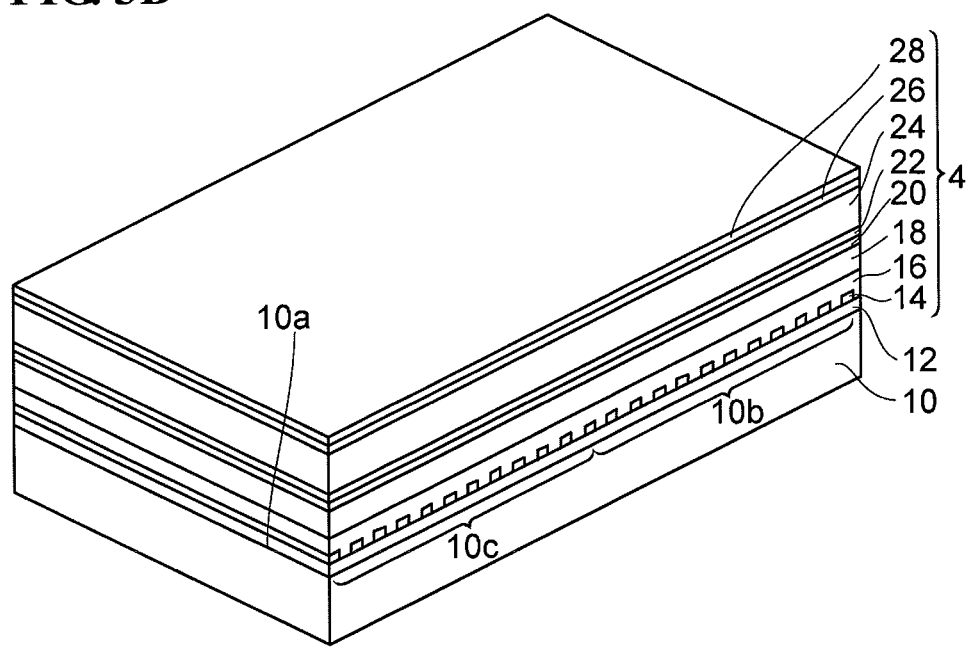

Referring to FIG. 3B, on the grating layer 14 in which the diffraction grating is formed, a spacer layer 16 (thickness with respect to the upper surface of the grating layer 14: 100 nm), an active layer 18, a cladding layer 20 (thickness: 60 nm), a first etch-stop layer 22 (thickness: 10 nm), a first cladding layer 24 (thickness: 460 nm), a side-etching layer 26 (thickness: 20 nm), and a capping layer 28 (thickness: 20 nm) are grown in this order (step S13 in FIG. 1). The spacer layer 16 is formed of, for example, n-type InP. The cladding layer 20 and the first cladding layer 24 are formed of, for example, p-type InP. The first etch-stop layer 22 is different in composition from the cladding layer 20 and the first cladding layer 24 and is disposed between the cladding layer 20 and the first cladding layer 24. Specifically, the first etch-stop layer 22 is formed of a material allowing etching selectivity with respect to the cladding layer 20 and the first cladding layer 24. The first etch-stop layer 22 is formed of, for example, p-type InGaAsP. The first etch-stop layer 22 has a bandgap wavelength of, for example, 1100 nm.

The side-etching layer 26 is formed of a material allowing etching selectivity with respect to the first cladding layer 24. The side-etching layer 26 is formed of, for example, p-type InGaAsP. The side-etching layer 26 has a bandgap wavelength of, for example, 1150 nm. The capping layer 28 is formed of, for example, p-type InP. The spacer layer 16, the cladding layer 20, the first etch-stop layer 22, the first cladding layer 24, the side-etching layer 26, and the capping layer 28 have an impurity concentration of, for example, $5 \times 10^{17}$ cm$^3$.

The active layer 18 serves as a first optical waveguiding layer in the first embodiment. For example, the active layer 18 has a multi quantum well (MQW) structure in which a barrier layer and a well layer are alternately stacked. The barrier layer is formed of, for example, InGaAsP, and has a bandgap wavelength of, for example, 1200 nm. The well layer is formed of, for example, InGaAsP. The composition of the well layer is adjusted such that light emitted from the active layer 18 has a wavelength of, for example, 1550 nm. Specifically, the well layer is formed of, for example, InGaAsP having a bandgap wavelength of 1590 nm. For example, the barrier layer has a thickness of 10 nm and the well layer has a thickness of 5 nm. The well layer may have, for example, 1% compressive strain. The number of the well layer is, for example, seven.

Separate confinement heterostructure (SCH) layers having a composition providing a smaller refractive index than the active layer 18 may be further disposed as an overlying layer and an underlying layer of the active layer 18. The SCH layers are formed of, for example, InGaAsP of which composition has a bandgap wavelength of, for example, 1150 nm. The overlying and underlying SCH layers each have a thickness of, for example, 50 nm.

As a result of the above-described steps, a first stacked semiconductor layer 4 illustrated in FIG. 3B is formed on the main surface 10a of the n-type InP substrate 10. The first stacked semiconductor layer 4 includes the grating layer 14, the spacer layer 16, the active layer 18, the cladding layer 20, the first etch-stop layer 22, the first cladding layer 24, the side-etching layer 26, and the capping layer 28. A portion of the first stacked semiconductor layer 4, the portion being formed on the first region 10b, functions as a distributed feedback (DFB) laser diode.

<First Etching Step>

Figure 4:
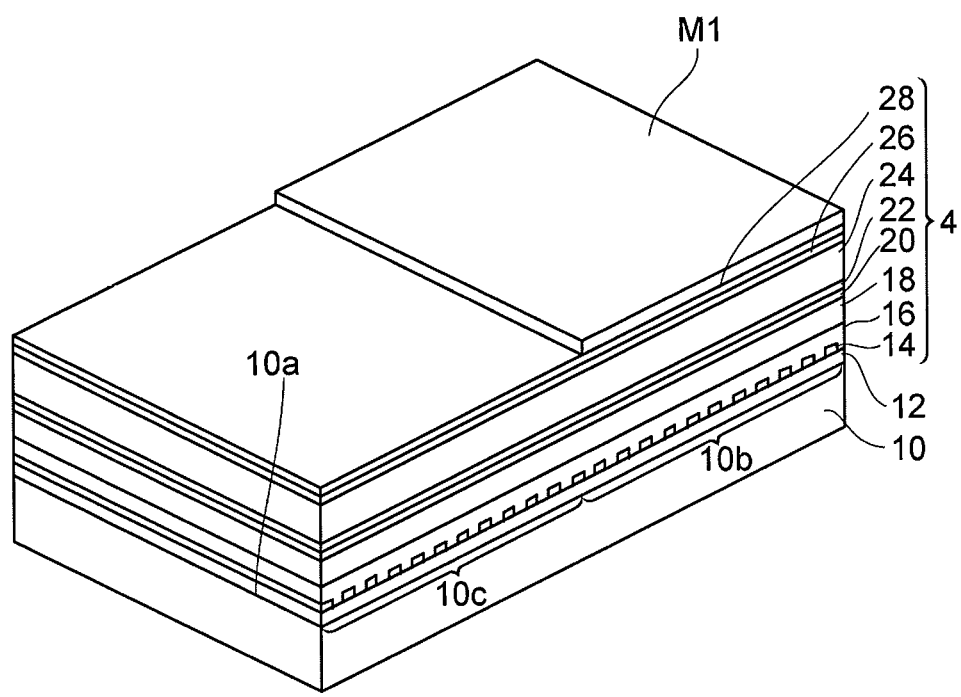
FIG. 4 illustrates a first etching step.

Referring to FIG. 4, a first etching mask M1 covering a portion of the first stacked semiconductor layer 4, the portion being formed on the first region 10b, is then formed on the first stacked semiconductor layer 4 (step S14 in FIG. 1). The first etching mask M1 is a dielectric film formed of, for example, SiO$_2$ or SiN. For example, the first etching mask M1 is deposited on the first stacked semiconductor layer 4 by a chemical vapor deposition (CVD) method. After that, a resist mask is formed on the first etching mask M1 by the standard photolithography technique. The first etching mask M1 is etched through the resist mask. As a result of such processes, the first etching mask M1 is suitably formed.

Figure 5A:
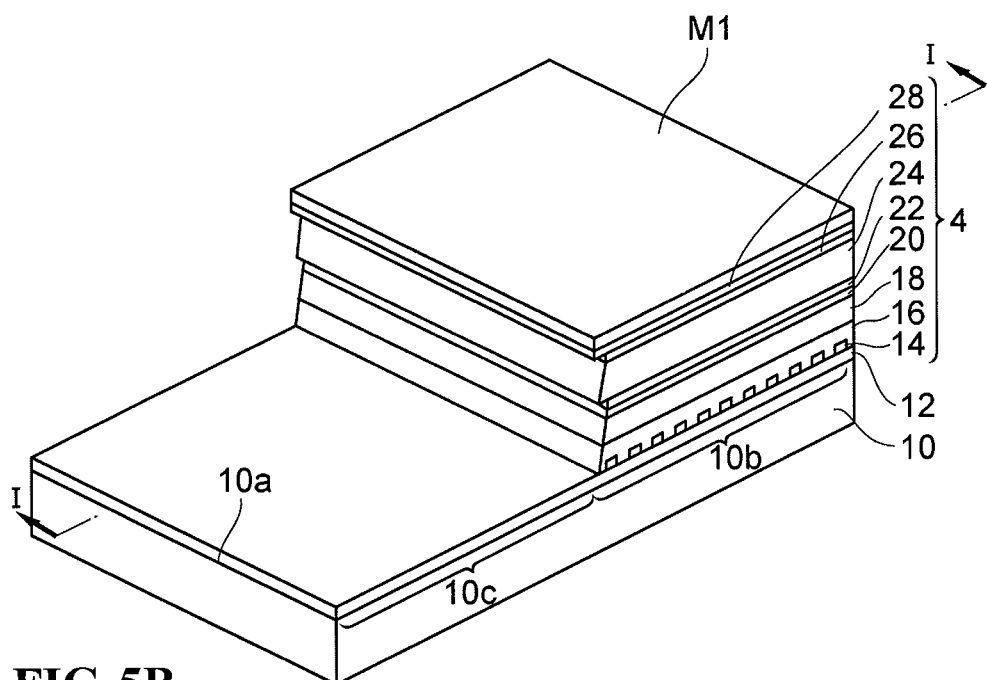
FIGS. 5A and 5B illustrate a first etching step.

Referring to FIG. 5A, a portion of the first stacked semiconductor layer 4, the portion being formed on the second region 10c, is then etched through the first etching mask M1 by, for example, wet etching. As a result of this etching, the active layer 18 is exposed (step S15 in FIG. 1). For example, in the first embodiment, etching is performed with different etchants selected for semiconductor layers of the first stacked semiconductor layer 4 until the buffer layer 12 is exposed. In particular, the side-etching layer 26 and the first etch-stop layer 22 are etched by wet etching with an etchant having higher etching rates for these layers than for the capping layer 28, the first cladding layer 24, and the cladding layer 20.

In an example, an etchant containing hydrochloric acid and acetic acid is used for etching the capping layer 28. On the other hand, an etchant containing hydrogen bromide is used for etching the first cladding layer 24, the cladding layer 20, and the spacer layer 16 that are mainly formed of InP. Another etchant containing sulfuric acid and hydrogen peroxide is used for etching the side-etching layer 26 and the first etch-stop layer 22 that are mainly formed of InGaAsP. As a result, these layers can be etched faster than the capping layer 28, the first cladding layer 24, and the cladding layer 20. The active layer 18 and the grating layer 14 that are mainly formed of InGaAsP are preferably etched with an etchant containing hydrochloric acid and hydrogen peroxide.

Figure 5B:
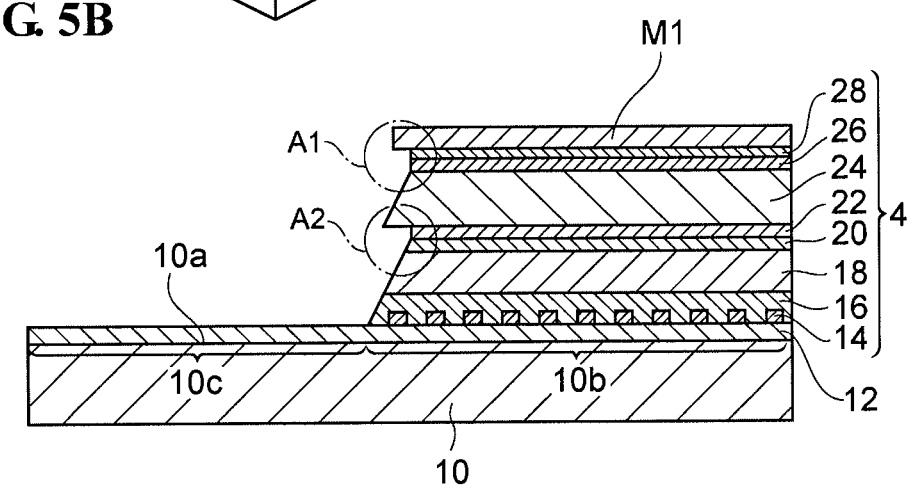

FIG. 5B is a sectional side view illustrating a section taken along line I-I in FIG. 5A. In the first embodiment, the etched end surface of the first stacked semiconductor layer 4 is mainly constituted by the (111) planes of InP-based semiconductors and has a normal mesa structure. When the side-etching layer 26 is etched, the etching rate for the side-etching layer 26 is higher than that for the capping layer 28 and the first cladding layer 24. Accordingly, the end surface of the side-etching layer 26 is etched farther in than the end surfaces of the capping layer 28 and the first cladding layer 24. Thus, as illustrated in a portion A1 in FIG. 5B, an overhang is formed between the first etching mask M1 and the first cladding layer 24 (overhang forming step). Similarly, when the first etch-stop layer 22 is etched, the etching rate for the first etch-stop layer 22 is higher than those for the first cladding layer 24 and the cladding layer 20. Accordingly, the end surface of the first etch-stop layer 22 is etched farther in than the end surfaces of the first cladding layer 24 and the cladding layer 20. Thus, as illustrated in a portion A2 in FIG. 5B, another overhang is formed between the first cladding layer 24 and the cladding layer 20.

<Second Growth Step>

Figure 6A:
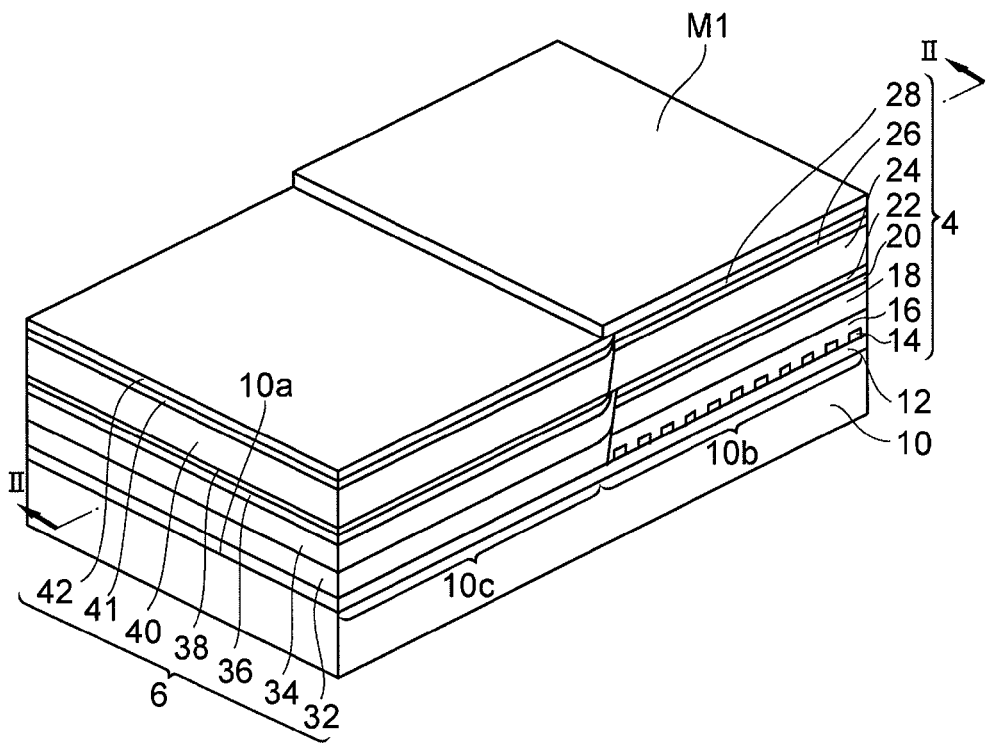
FIGS. 6A and 6B illustrate a second growth step.

Referring to FIG. 6A, on the second region 10c of the main surface 10a of the n-type InP substrate 10, a buffer layer 32 (thickness: 50 nm), an optical waveguiding layer 34, a cladding layer 36 (thickness: 60 nm), a second etch-stop layer 38 (thickness: 10 nm), a second cladding layer 40, a semiconductor layer 41, and a capping layer 42 are selectively grown through the first etching mask M1 (butt-joint coupling step, step S16 in FIG. 1). The thickness of the second cladding layer 40 is adjusted such that the second cladding layer 40 is flush with the upper surface of the first cladding layer 24. The buffer layer 32 is formed of, for example, n-type InP. The cladding layer 36 and the second cladding layer 40 are formed of, for example, p-type InP. The second etch-stop layer 38 is different in composition from the second cladding layer 40 and is positioned between the cladding layer 36 and the second cladding layer 40. Specifically, the second etch-stop layer 38 is formed of a material allowing etching selectivity with respect to the second cladding layer 40. The second etch-stop layer 38 is formed of, for example, p-type InGaAsP. The second etch-stop layer 38 has a bandgap wavelength of, for example, 1100 nm.

The semiconductor layer 41 is formed of, for example, p-type InGaAsP. The semiconductor layer 41 has a bandgap wavelength of, for example, 1150 nm. The capping layer 42 is formed of, for example, p-type InP. The buffer layer 32, the cladding layer 36, the second etch-stop layer 38, the second cladding layer 40, the semiconductor layer 41, and the capping layer 42 have an impurity concentration of, for example, $5 \times 10^{17}$ cm$^{-3}$.

The optical waveguiding layer 34 serves as a second optical waveguiding layer in the first embodiment. The optical waveguiding layer 34 has, for example, a multi quantum well (MQW) structure in which a barrier layer and a well layer are alternately stacked. The barrier layer is formed of, for example, InGaAsP, and has a bandgap wavelength of, for example, 1400 nm. The well layer is formed of, for example, InGaAsP and has a bandgap wavelength of, for example, 1500 nm. The barrier layer has a thickness of, for example, 10 nm. The well layer has a thickness of, for example, 6 nm. The well layer may have, for example, 1% compressive strain.

Figure 6B:
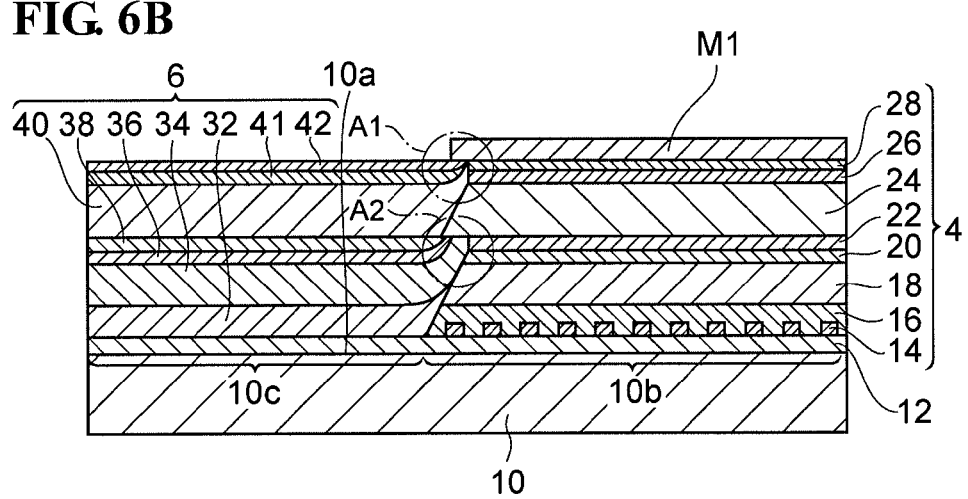

FIG. 6B is a sectional side view illustrating a section taken along line II-II in FIG. 6A. As a result of the above-described first etching step, the overhang is formed (portion A1 in FIG. 6B) between the first cladding layer 24 and the first etching mask M1. During growth of the second cladding layer 40 in the second growth step, this overhang effectively suppresses rising up of the second cladding layer 40 in a region near the boundary between the second cladding layer 40 and the first stacked semiconductor layer 4. In addition, as a result of the above-described first etching step, another overhang is formed (portion A2 in FIG. 6B) between the cladding layer 20 and the first cladding layer 24. During growth of the second optical waveguiding layer 34 in the second growth step, this overhang effectively suppresses rising up of the second optical waveguiding layer 34 in a region near the boundary between the second optical waveguiding layer 34 and the first stacked semiconductor layer 4.

As a result of the above-described steps, a second stacked semiconductor layer 6 illustrated in FIGS. 6A and 6B is formed on the main surface 10a of the n-type InP substrate 10. The second stacked semiconductor layer 6 includes the buffer layer 32, the optical waveguiding layer 34, the cladding layer 36, the second etch-stop layer 38, the second cladding layer 40, the semiconductor layer 41, and the capping layer 42. The second stacked semiconductor layer 6 functions as, for example, an electric absorption (EA) optical modulator. The first etching mask M1 is then removed with, for example, hydrofluoric acid.

<Third Growth Step>

Figure 7A:
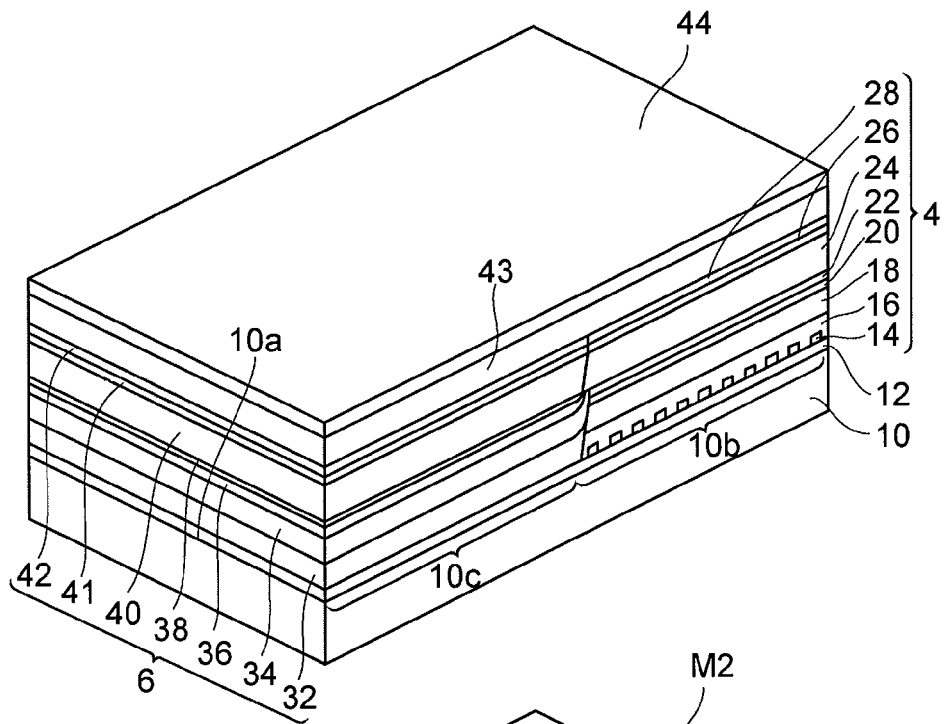
FIG. 7A illustrates a third growth step.

Referring to FIG. 7A, on the main surface 10a extending from the first stacked semiconductor layer 4 to the second stacked semiconductor layer 6, a third cladding layer 43 (thickness: 1200 nm) and a contact layer 44 (thickness: 100 nm) are grown in this order (step S17 in FIG. 1). The third cladding layer 43 is formed of, for example, p-type InP. The contact layer 44 is formed of a semiconductor material that is used for forming an ohmic contact with an anode electrode (metal electrode) formed in a subsequent step. The contact layer 44 is formed of, for example, p-type InGaAs. The third cladding layer 43 has an impurity concentration of, for example, $1 \times 10^{18}$ cm$^{-3}$. The contact layer 44 has an impurity concentration of, for example, $1.5 \times 10^{19}$ cm$^{-3}$.

<Second Etching Step>

Figure 7B:
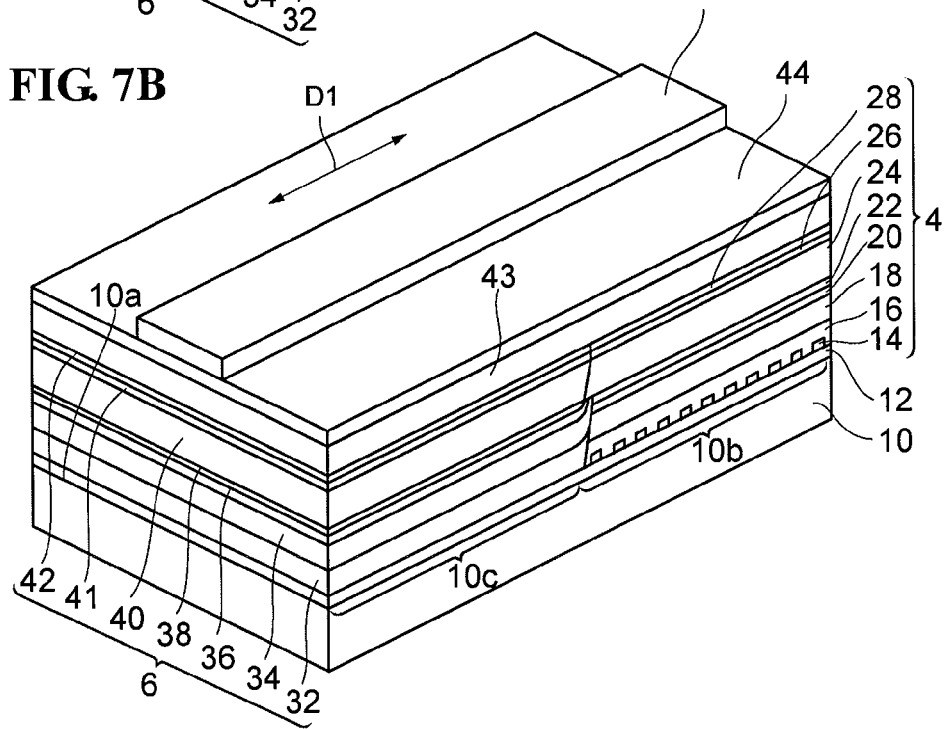
FIG. 7B illustrates a second etching step.
Figure 8:
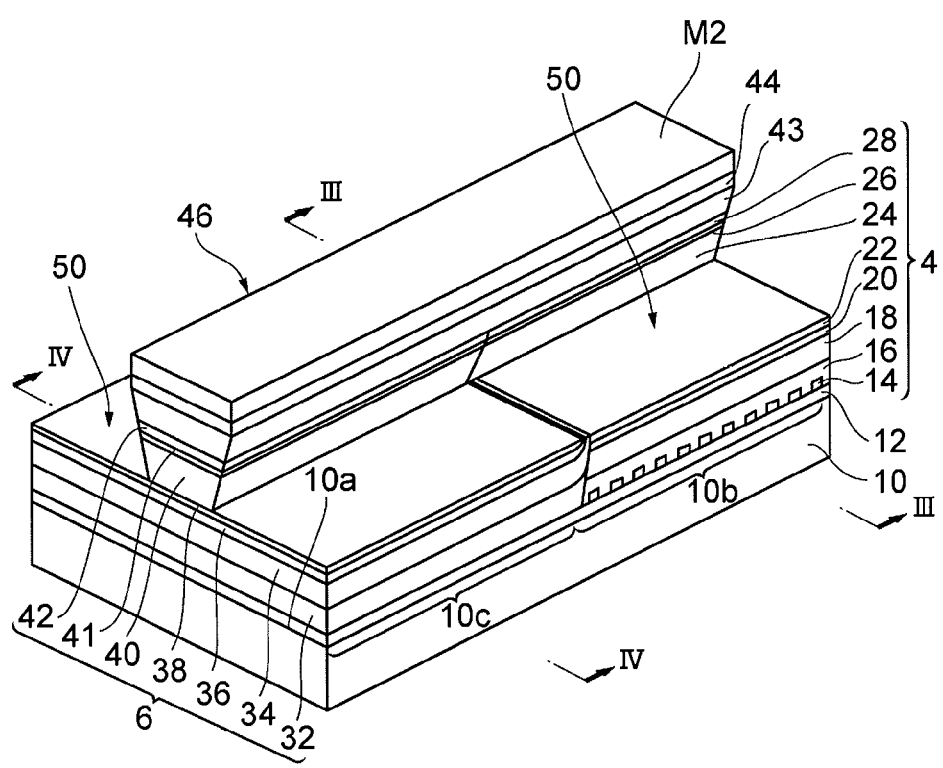
FIG. 8 illustrates a second etching step.

Referring to FIG. 7B, a second etching mask M2 longitudinally extending in the predetermined direction D1 is formed on the first stacked semiconductor layer 4 and the second stacked semiconductor layer 6 (in the first embodiment, on the contact layer 44) (step S18 in FIG. 1). The second etching mask M2 has the shape of a stripe. The second etching mask M2 is a dielectric film formed of, for example, SiO$_2$ or SiN. For example, a SiO$_2$ layer is deposited on the contact layer 44 by a CVD method. After that, a resist mask is formed on the SiO$_2$ layer by the standard photolithography technique. The SiO$_2$ layer is etched through the resist mask. As a result, the second etching mask M2 is suitably formed. Referring to FIG. 8, the contact layer 44, the third cladding layer 43, the side-etching layer 26, the semiconductor layer 41, the first cladding layer 24, and the second cladding layer 40 are etched through the second etching mask M2 to form a ridge structure 46 (step S19 in FIG. 1).

On lateral sides of the second etching mask M2, other etching masks (not shown) having lateral edges extending along the lateral edges of the second etching mask M2 are further disposed so as to be separated from the second etching mask M2. Thus, each of the side surfaces of the ridge structure 46 constitutes a side wall of a groove 50 extending in the longitudinal direction (predetermined direction D1) of the ridge structure 46 and formed in the first and second stacked semiconductor layers 4 and 6. In FIG. 8, in order to clearly illustrate the ridge structure 46, the other side wall of the groove 50 is omitted (refer to FIG. 11A).

Figure 9A:
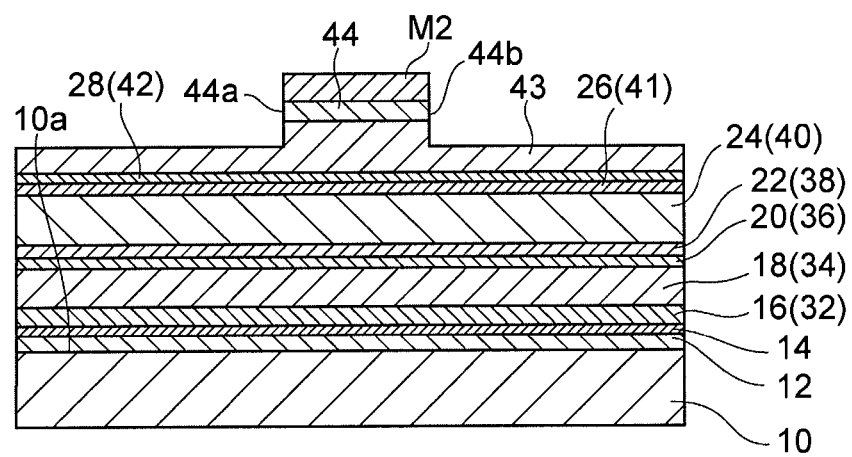
FIGS. 9A and 9B specifically illustrate a second etching step.
Figure 9B:
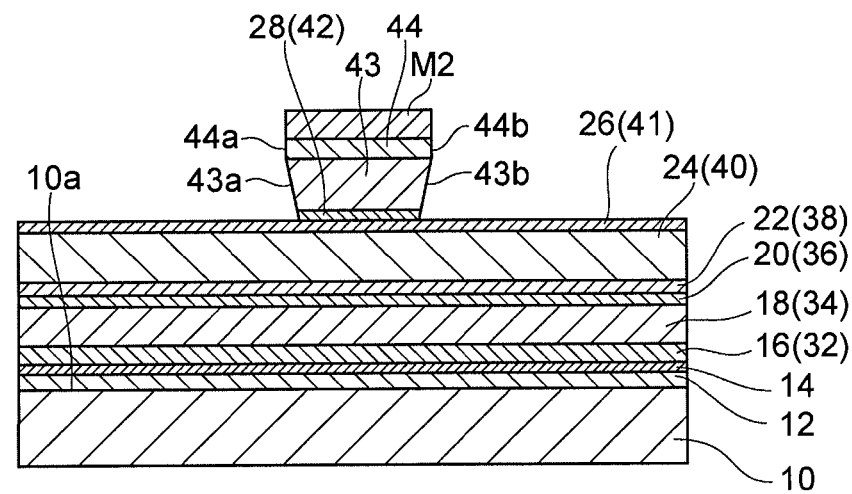
Figure 10A:
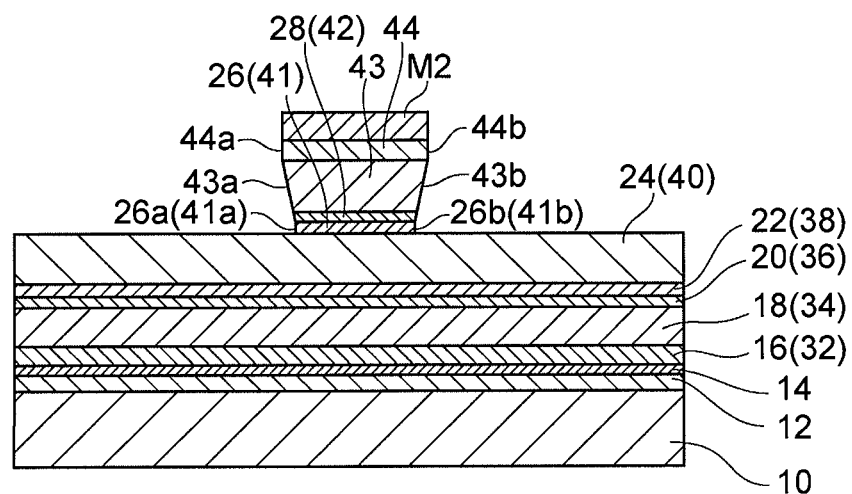
FIGS. 10A and 10B specifically illustrate a second etching step.
Figure 10B:
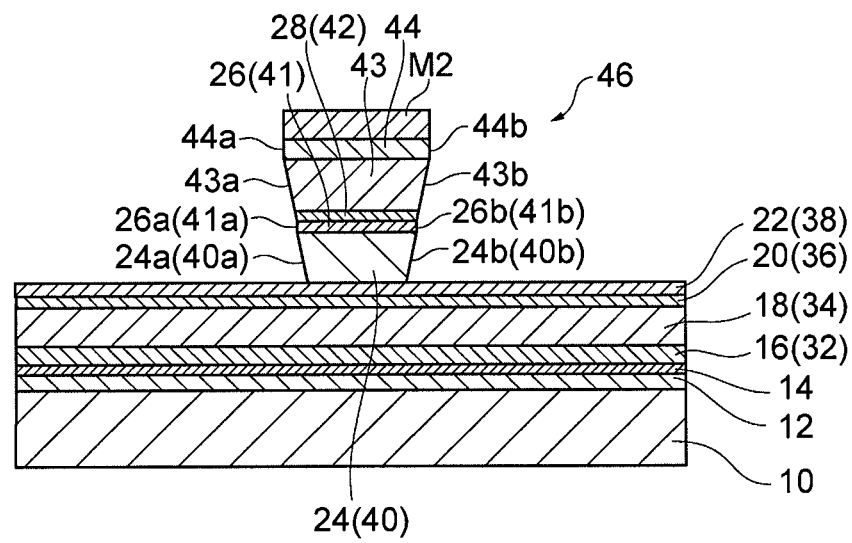

FIGS. 9A, 9B, 10A, and 10B specifically illustrate the second etching step illustrated in FIG. 8. FIGS. 9A and 9B illustrate sections taken along line in FIG. 8 (that is, sections of the first stacked semiconductor layer 4). FIGS. 10A and 10B illustrate sections taken along line IV-IV in FIG. 8 (that is, sections of the second stacked semiconductor layer 6).

Referring to FIG. 9A, in the second etching step, the contact layer 44 and the third cladding layer 43 are etched by dry etching using, for example, a gas mixture of methane gas (CH$_4$) and hydrogen gas (H$_2$) as an etching gas. This dry etching is stopped in the middle of the third cladding layer 43. In this dry etching, the side-etching layer 26 and the semiconductor layer 41 are not exposed. As a result of the dry etching, side surfaces 44a and 44b of the contact layer 44 are formed so as to be substantially perpendicular to the main surface 10a.

Referring to FIG. 9B, the third cladding layer 43 is selectively etched by a wet etching technique (first wet-etching step). An etchant used for this wet etching preferably has higher etching rate for the third cladding layer 43 than etching rates for the side-etching layer 26, the semiconductor layer 41, and the contact layer 44. In an example, an etchant containing hydrogen bromide can be used. The etching by the wet etching technique is stopped when the side-etching layer 26 and the semiconductor layer 41 are exposed. As a result of the etching by the wet etching technique, side surfaces 43a and 43b of the third cladding layer are formed. As illustrated in FIG. 9B, the side surfaces 43a and 43b constitute a reverse mesa structure with respect to the main surface 10a and mainly include, for example, the (111) planes of InP crystals. Since the etching rate of the contact layer 44 is slower than the etching rate of the third cladding layer 43, the width of the contact layer 44 is not substantially changed.

Referring to FIG. 10A, the side-etching layer 26 and the semiconductor layer 41 are selectively etched by a wet etching technique (second wet-etching step). An etchant used for this wet etching preferably has higher etching rates for the side-etching layer 26 and the semiconductor layer 41 than etching rates for the first, second and third cladding layers 24, 40, and 43. In an example, an etchant containing sulfuric acid and hydrogen peroxide can be used. As a result of the etching by the wet etching technique, side surfaces 26a and 26b of the side-etching layer 26 and side surfaces 41a and 41b of the semiconductor layer 41 are formed. In these steps, the widths of the side-etching layer 26 and the semiconductor layer 41 is closer to the width of the bottom of the third cladding 43. Preferably, the widths of the side-etching layer 26 and the semiconductor layer 41 is substantially equal to the width of the bottom of the third cladding 43, as illustrated in FIG. 10A. Since the etching rate of the third cladding layer 43 is slower than etching rates of the side-etching layer 26 and the semiconductor layer 41, the width of the third cladding 43 is not substantially changed. In addition, shapes of the side surfaces 43a and 43b of the third cladding layer 43 are not substantially changed.

Referring to FIG. 10B, the first and second cladding layer 24 and 40 are selectively etched by a wet etching technique (third wet-etching step). An etchant used for this wet etching preferably has higher etching rates for the first and second cladding layer 24 and 40 than etching rates for the contact layer 44, the semiconductor layer 41, the side-etching layer 26, the first etch-stop layer 22, and the second etch-stop layer 38. In an example, an etchant containing hydrogen bromide can be used. The etching by the wet etching technique is stopped when the first and second etch-stop layers 22 and 38 are exposed. As a result of the etching by the wet etching technique, side surfaces 24a and 24b of the first cladding layer 24 and side surfaces 40a and 40b of the second cladding layer 40 are formed. The side surfaces 24a and 24b of the first cladding layer 24 and the side surfaces 40a and 40b of the second cladding layer 40 constitute a reverse mesa structure with respect to the main surface 10a and mainly include, for example, the (111) planes of InP crystals. Since the etching rates of the side-etching layer 26 and the semiconductor layer 41 are slower than the etching rates of the first and second cladding layers 24 and 40, the widths of the side-etching layer 26 and the semiconductor layer 41 are not substantially changed. Furthermore, since the side surfaces 43a and 43b of the third cladding layer 43 are formed along the predetermined crystal planes (that is the (111) planes of InP crystals), the width of the third cladding 43 is not almost changed. In addition, the shapes of the side surfaces 43a and 43b of the third cladding layer 43 are not almost changed.

Subsequent Steps

As a result of the above-described steps, a substrate product in which the ridge structure 46 is formed in the first and second stacked semiconductor layers 4 and 6 is produced. FIGS. 11A to 13B are explanatory views for subsequent steps (step S20 in FIG. 1) for the substrate product. FIGS. 11A to 13A illustrate sections corresponding to sections taken along line in FIG. 8 (sections of the first stacked semiconductor layer 4). The steps are similarly performed for the second stacked semiconductor layer 6. FIG. 13B illustrates a section taken along line V-V in FIG. 13A.

Figure 11A:
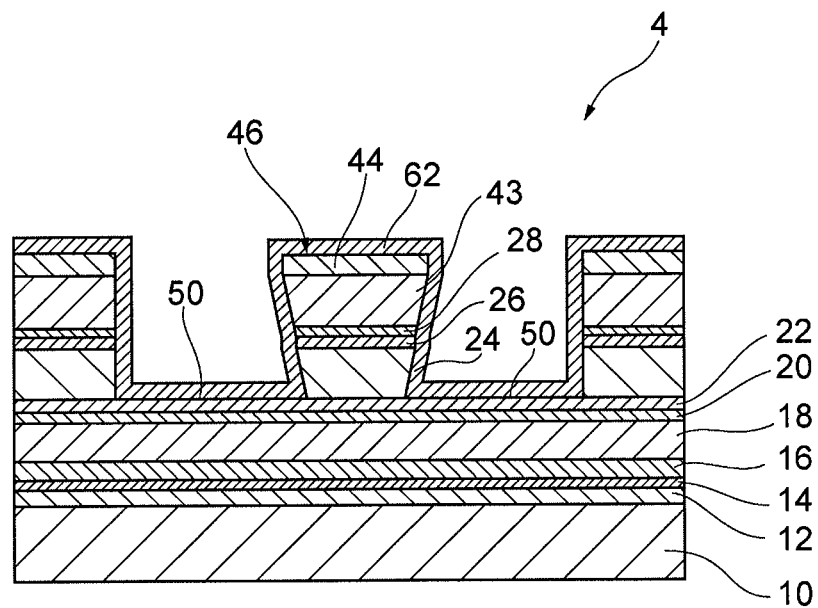
FIGS. 11A and 11B are explanatory views for subsequent steps for a substrate product.

The subsequent steps are performed in the following manner. Referring to FIG. 11A, a protective film (passivation film) 62 for protecting the first and second stacked semiconductor layers 4 and 6 is formed on the surfaces of the first and second stacked semiconductor layers 4 and 6. At this time, for example, the protective film 62 is constituted by a dielectric film made of, for example, SiO$_2$ or SiN. The protective film 62 is formed by a CVD method. The protective film 62 is formed so as to cover at least the upper surface and side surfaces of the ridge structure 46.

Figure 11B:
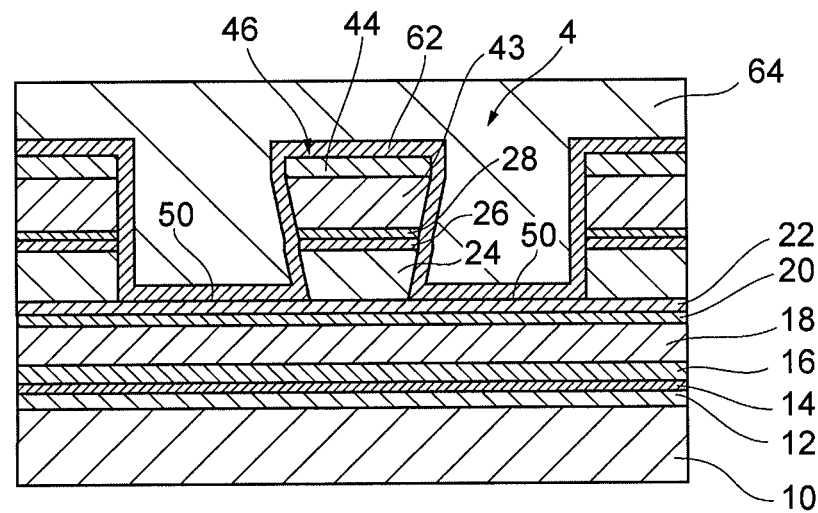

Referring to FIG. 11B, for example, a bisbenzocyclobutene (BCB) resin is then applied to the surfaces of the first and second stacked semiconductor layers 4 and 6 by spin coating to form a resin layer 64. The resin layer 64 is then heat-treated to be cured. As a result of this step, the grooves 50 formed on the lateral sides of the ridge structure 46 are filled with the resin layer 64. Thus, the resin layer 64 provides a flat surface for the substrate product. The resin layer 64 may be formed of a photosensitive BCB resin.

Figure 12A:
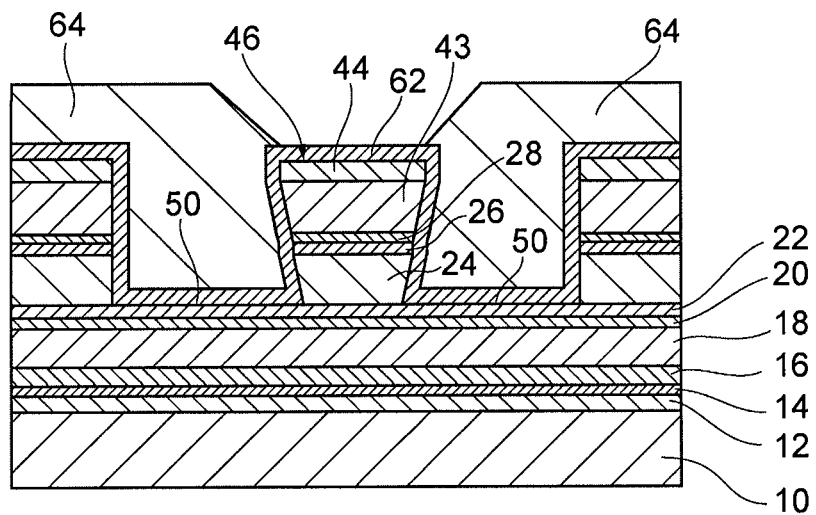
FIGS. 12A and 12B are explanatory views for subsequent steps for a substrate product.

Referring to FIG. 12A, the resin layer 64 is then exposed and developed by a photolithography technique to remove a portion of the resin layer 64 above the ridge structure 46. As a result of this step, the protective film 62 on the ridge structure 46 is exposed.

Figure 12B:
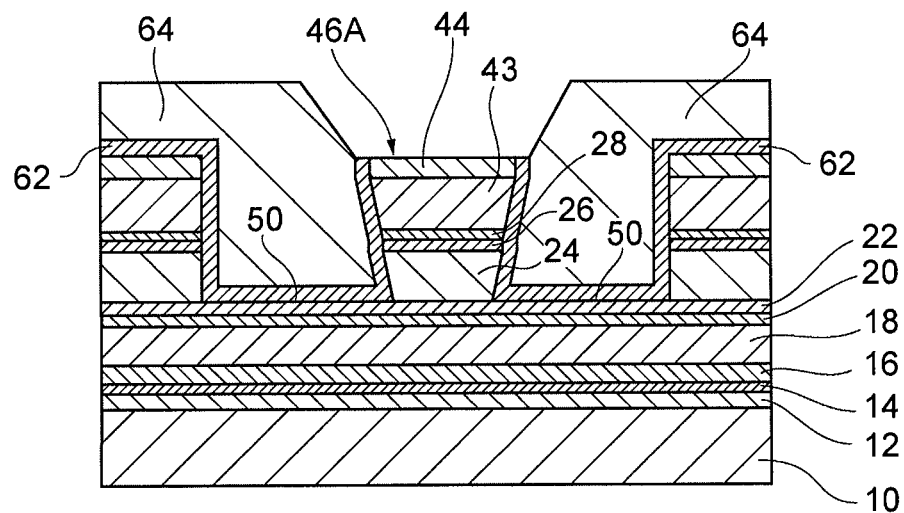

Referring to FIG. 12B, the protective film 62 on the ridge structure 46 is then removed by etching with the resin layer 64 serving as a mask. At this time, the protective film 62 is etched by a dry etching process with, for example, a CF-based gas. As a result of this step, the upper surface of the ridge structure 46 (contact layer 44) is exposed.

Figure 13A:
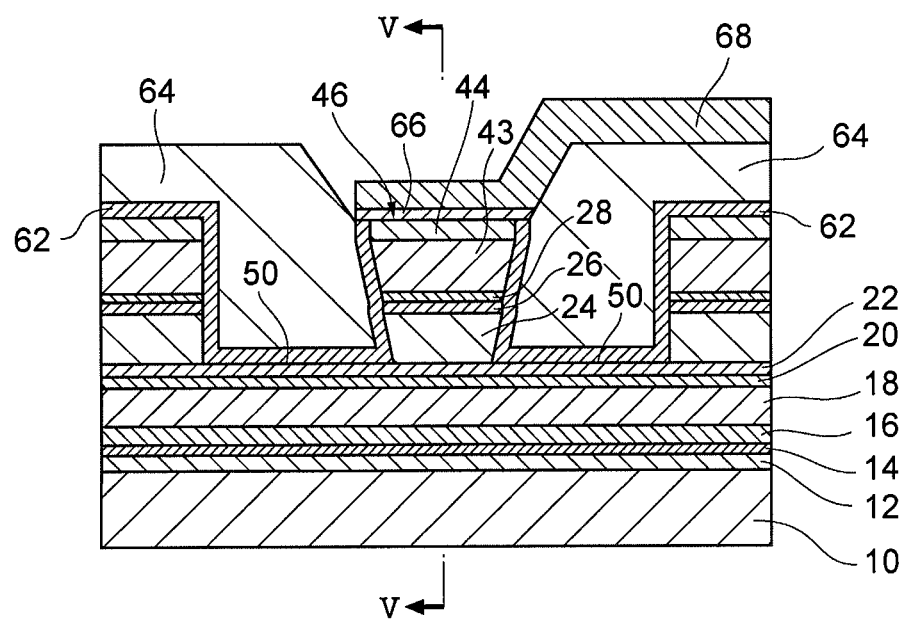
FIGS. 13A and 13B are explanatory views for subsequent steps for a substrate product.
Figure 13B:
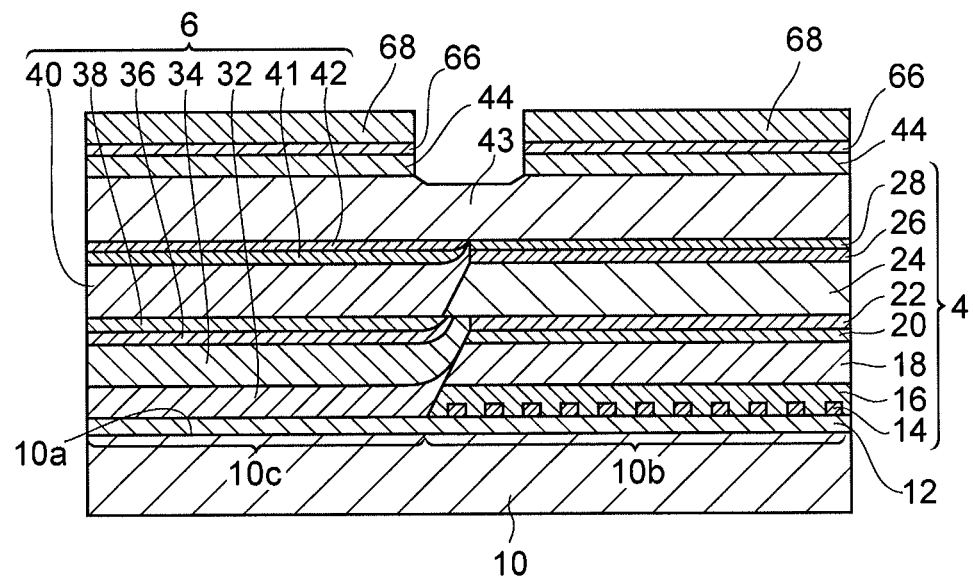
Figure 14A:
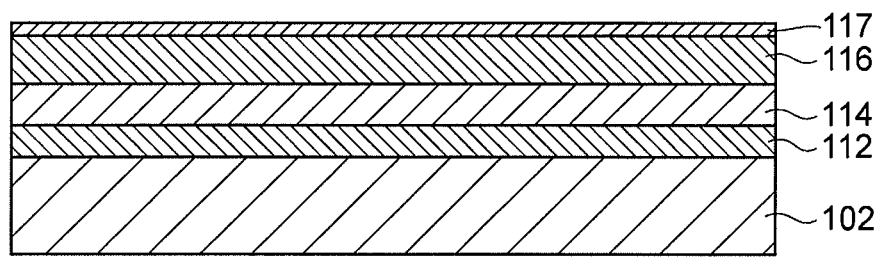
FIGS. 14A to 14C illustrate an example of a method for producing an integrated optical device having a butt-joint structure.
Figure 14B:
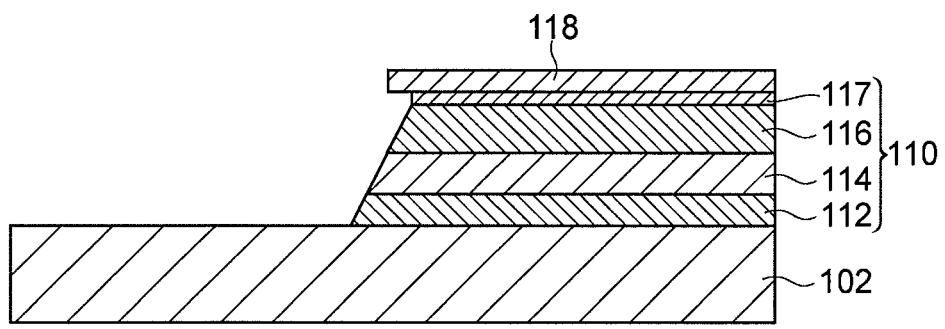
Figure 14C:
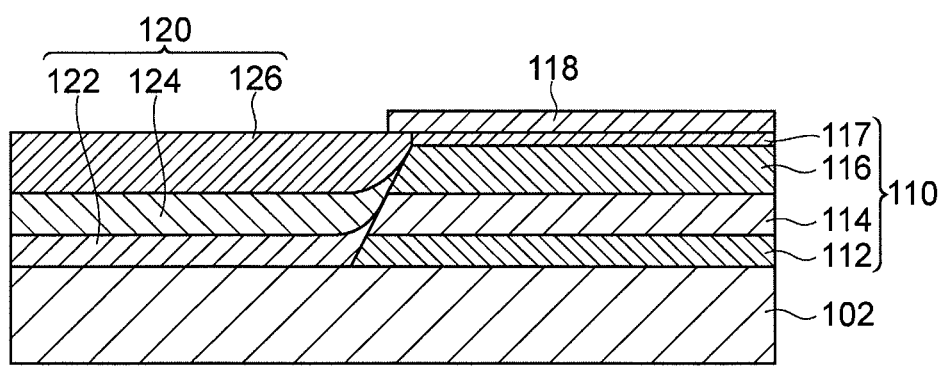
Figure 15A:
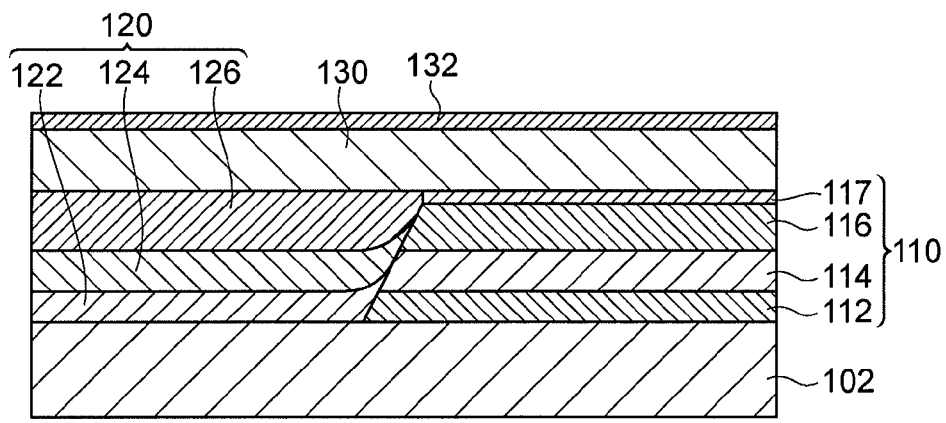
FIGS. 15A and 15B illustrate an example of a method for producing an integrated optical device having a butt-joint structure.
Figure 15B:
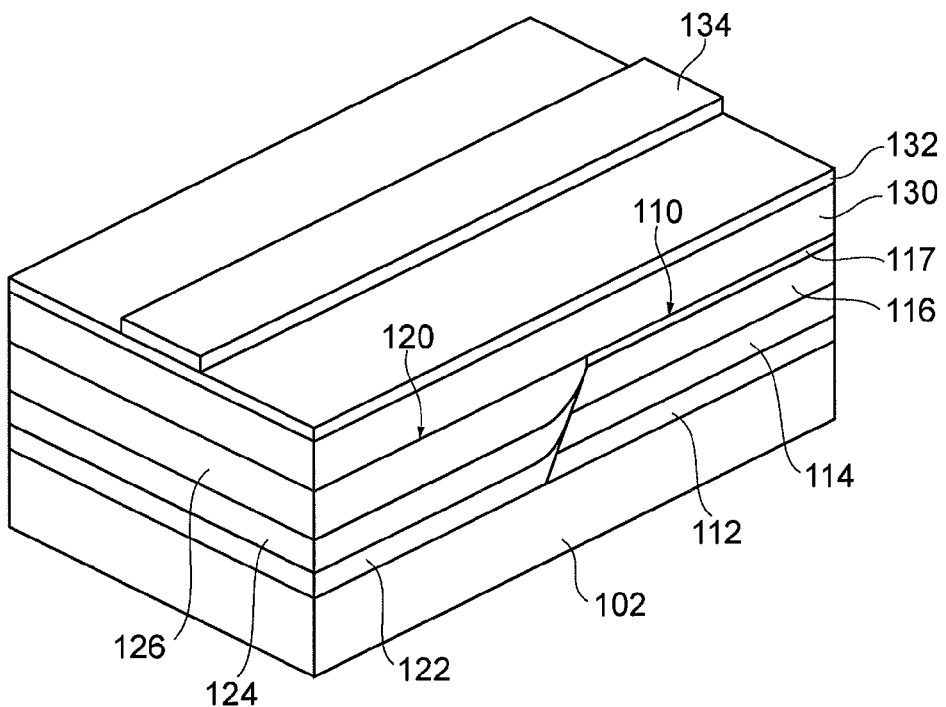

Referring to FIGS. 13A and 13B, an ohmic electrode 66 is then formed on the ridge structure 46. In addition, a metal wire 68 is continuously formed on the ohmic electrode 66 and the resin layer 64. Referring to FIG. 13B, in order to electrically separate the ohmic electrode 66 and the metal wire 68 on the first stacked semiconductor layer 4 from the ohmic electrode 66 and the metal wire 68 on the second stacked semiconductor layer 6, portions of the ohmic electrode 66 and the metal wire 68 are removed by etching. In addition, a portion of the contact layer 44 is removed by etching to achieve separation between the contact layer 44 on the first stacked semiconductor layer 4 and the contact layer 44 on the second stacked semiconductor layer 6.

After the above-described steps are performed, the resultant substrate product is divided into chips to complete integrated optical devices.

Figure 16A:
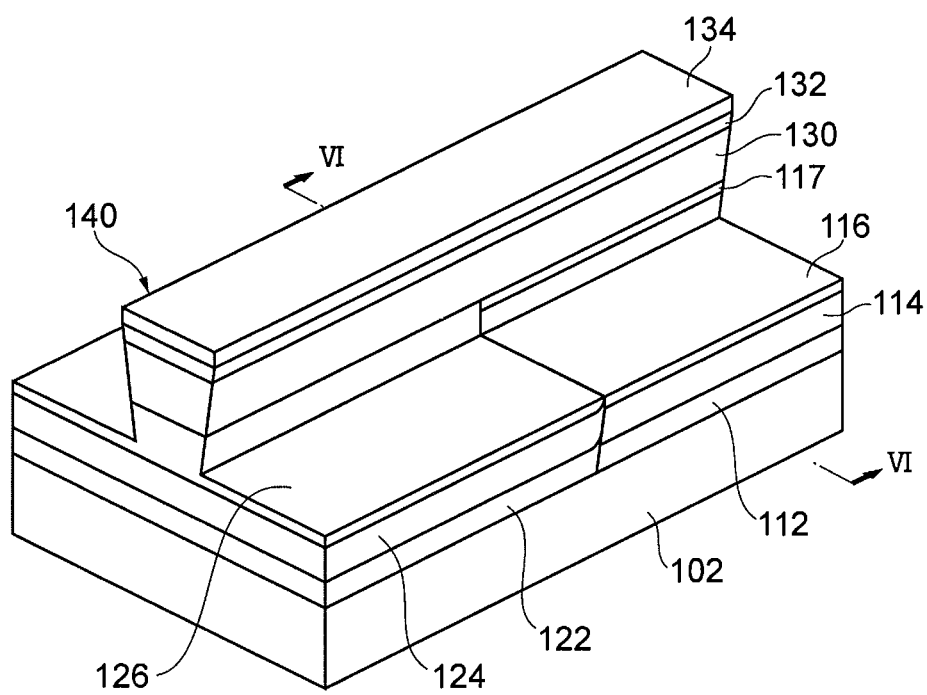
FIGS. 16A and 16B illustrate an example of a method for producing an integrated optical device having a butt-joint structure.
Figure 16B:
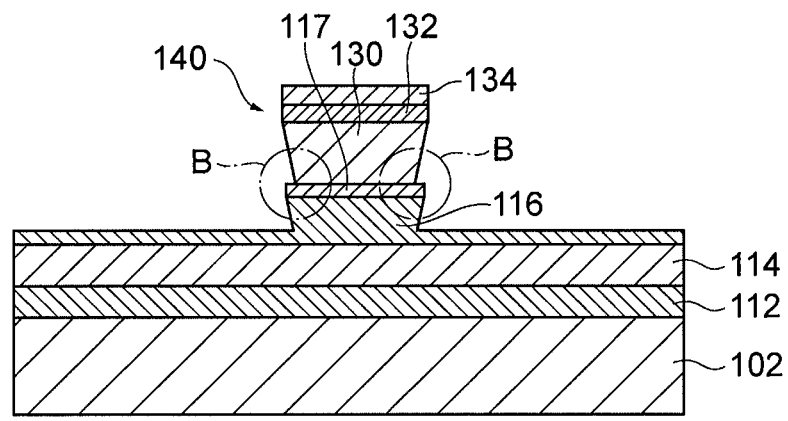

In the above-described production method according to the first embodiment, the first stacked semiconductor layer 4, the second stacked semiconductor layer 6, the third cladding layer 43, and contact layer 44 are grown in the first growth step S11 to S13, the first etching step S14 to S15, the second growth step S16, and the third growth step S17. The ridge structure 46 having the reverse mesa structure is then formed in the second etching step S18 to S19. In the first growth step S13, the side-etching layer 26 that is included in the first stacked semiconductor layer 4 is grown. An overhang is formed by using the side-etching layer 26 in the first etching step S15 (refer to the portion A1 in FIG. 5B). When the ridge structure is formed by using a conventional method, stepped structures are formed at the side surfaces of the ridge structure (refer to the portions B in FIG. 16B). Due to the stepped structures, a resistance of the device increases and an optical waveguide mode is disturbed. Furthermore, it is difficult to form a protective film (passivation film) on the side surfaces of the ridge structure.

In the production method according to the first embodiment, side surfaces 43a and 43b of the third cladding layer 43 are formed by selectively etching the third cladding layer 43 using wet etching in the second etching step S19 in which the ridge structure 46 is formed (refer to FIG. 9B). Then, side surfaces 26a and 26b of the side-etching layer 26 are formed by selectively etching the side-etching layer 26 using wet etching (refer to FIG. 10A). After etching the side-etching layer 26, side surfaces 24a, 24b of the first cladding layer 24 and side surfaces 40a and 40b of the second cladding layer 40 are formed by selectively etching the first and second cladding layers using wet etching (refer to FIG. 10B). Therefore, when the side-etching layer 26 is selectively etched by wet etching, the width of the side-etching layer 26 (width of the ridge structure 46 in a direction perpendicular to the direction D1) can be narrowed. As a result, formation of the stepped structure in the side surfaces of the ridge structure 46 can be avoided. Accordingly, the increase of the resistance of the device and the disturbance in the optical waveguide mode are suppressed. In addition, the protective film (passivation film) 62 is properly formed on the side surfaces of the ridge structure 46.

In the production method according to the first embodiment, a dry etching step in which the contact layer 44 is etched by dry etching is further included in the second etching step S19 (refer to FIG. 9A). As a result of the dry etching step, side surfaces 44a and 44b of the contact layer 44 are formed so as to be substantially perpendicular to the main surface 10a. In addition, the width of the contact layer 44 (width in a direction perpendicular to the direction D1) is precisely controlled. The width of the third cladding layer 43 is defined by the width of the contact layer 44 in the first wet-etching step (refer to FIG. 9B). Therefore, the width of the third cladding layer 43 is also controlled precisely.

In the production method according to the first embodiment, the first, second, and third cladding layers 24, 40 and 43 have side surfaces including the (111) planes of InP crystals, the side surfaces of the first, second and third cladding layers being formed in the first and third wet-etching step (refer to FIGS. 9B and 10B). In this case, the side surfaces 24a and 24b of the first cladding layer 24, the side surfaces 40a and 40b of the second cladding layer 40, and the side surfaces 43a and 43b of the third cladding layer 43 constitute a reverse mesa structure with respect to the main surface 10a. Therefore, the widths of the first, second and third cladding layers are more precisely controlled. In addition, a pass of current injected into the semiconductor laser formed, for example, on the first region 10b is narrowed and the injected current is confined in the active layer 18 under the ridge structure 46. As a result, good laser characteristics of, for example, a low threshold current and a high slope efficiency are obtained.

In the production method according to the first embodiment, the second stacked semiconductor layer 6 grown in the second growth step S16 includes the semiconductor layer 41 on the second cladding layer 40. The semiconductor layer 41 has the same composition as the side-etching layer 26. In the first wet-etching step, the etching for the third cladding layer 43 is stopped when the side-etching layer 26 and the semiconductor layer 41 are exposed. As a result, an etching depth in etching the third cladding layer 43 is precisely controlled in the first and second stacked semiconductor layers 4 and 6. In addition, the side surfaces of the third cladding layer 43 are properly formed.

In the production method according to the first embodiment, the first stacked semiconductor layer 4 grown in the first growth step S13 includes the first etch-stop layer 22. The first etch-stop layer 22 is a semiconductor layer different in composition from the cladding layer 20 and the first cladding layer 24 and is positioned between the cladding layer 20 and the first cladding layer 24. Regarding the first etching step S15, the compositions of the semiconductor layers and an etchant are selected so that the etching rate for the first etch-stop layer 22 in wet etching is higher than the etching rates for the overlying and underlying layers (cladding layer 20 and first cladding layer 24). As a result, an overhang is formed between the cladding layer 20 and the first cladding layer 24 (refer to the portion A2 in FIG. 5B). During growth of the second optical waveguiding layer 34 in the second growth step S16, this overhang suppresses rising up of the second optical waveguiding layer 34 in a region near the boundary between the second optical waveguiding layer 34 and the first stacked semiconductor layer 4 (refer to the portion A2 in FIG. 6B).

Figure 17:
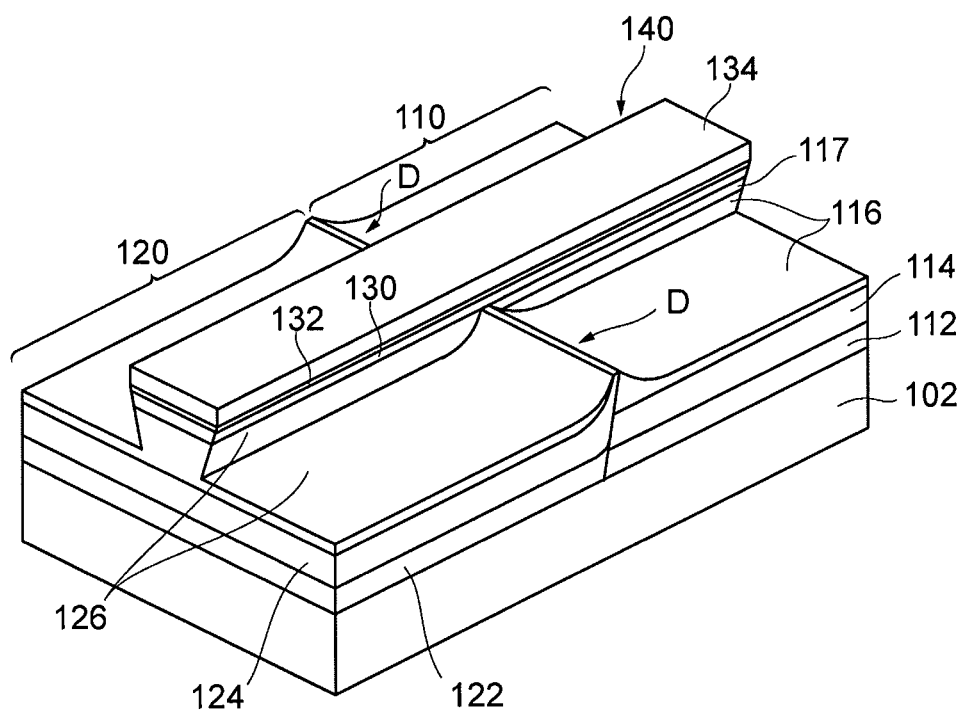
FIG. 17 is an explanatory view for a problem caused in a conventional method for producing an integrated optical device.

In a conventional production method, rising up or abnormal growth of the second optical waveguiding layer is occurred in a region near the boundary between the second optical waveguiding layer and the first stacked semiconductor layer. In the formation of the ridge structure 140 by etching, referring to FIG. 17, the risen-up portions of the optical waveguiding layer 124 and the upper cladding layers 116 and 126 are etched at different etching rates. As a result, the risen-up portions remain as raised portions in regions (regions D in FIG. 17) adjacent to the side surfaces of the ridge structure 140. Such raised portions may cause disturbance in the optical waveguide mode and influence on, for example, lasing characteristics of the semiconductor laser.

In the production method according to the first embodiment, the overhang formed between the cladding layer 20 and the first cladding layer 24 suppresses the rising up of the second optical waveguiding layer 34 in a region near the boundary between the second optical waveguiding layer 34 and the first stacked semiconductor layer 4. As a result, in the formation of the ridge structure 46 in the second etching step S19, as illustrated in FIG. 8, formation of raised portions in regions adjacent to the side surfaces of the ridge structure 46 (the regions are specifically bottom surfaces of the grooves 50) can be suppressed and the flatness of these regions can be enhanced. Therefore, by using the method for producing an integrated optical device according to the first embodiment, disturbance in the optical waveguide mode can be suppressed. Furthermore, lasing characteristics of the semiconductor laser can be improved.

The methods for producing an integrated optical device according to preferred embodiments of the present invention have been described so far with reference to examples, that is, structures in which a distributed feedback (DFB) laser diode and an EA optical modulator are integrated. However, the present invention is not necessarily limited to these embodiments and various modifications can be made without departing from the spirit and scope of the present invention.

What is claimed is:

1. A method for producing an integrated optical device, comprising the steps of:
   preparing a substrate including first and second regions arranged in a predetermined direction;
   growing, on the first and second regions of the substrate, a first stacked semiconductor layer including a first optical waveguiding layer, a first cladding layer positioned on the first optical waveguiding layer, and a side-etching layer positioned on the first cladding layer, the side-etching layer having a composition different from a composition of the first cladding layer;
   etching the first stacked semiconductor layer through a first etching mask formed on the first region until the first optical waveguiding layer is exposed;
   selectively growing, on the second region through the first etching mask, a second stacked semiconductor layer including a second optical waveguiding layer and a second cladding layer positioned on the second optical waveguiding layer, the second optical waveguiding layer being optically coupled to the first optical waveguiding layer;
   growing a third cladding layer and a contact layer on the first and second stacked semiconductor layers, and
   forming a ridge structure by etching the contact layer, the third cladding layer, the side-etching layer, and the first and second cladding layers through a second etching mask formed on the contact layer, the second etching mask longitudinally extending in the predetermined direction,
   wherein the step of etching the first stacked semiconductor layer includes a step of forming an overhang between the first cladding layer and the first etching mask by selectively etching the side-etching layer by wet etching with an etchant having a higher etching rate for the side-etching layer than for the first cladding layer, and
   wherein the step of forming a ridge structure includes a first wet-etching step of etching the third cladding layer by wet etching with an etchant having a higher etching rate for the third cladding layer than for the side-etching layer, a second wet-etching step of etching the side-etching layer by wet etching with an etchant having a higher etching rate for the side-etching layer than for the first, second, and third cladding layers, and a third wet-etching step of etching the first and second cladding layers by wet etching with an etchant having a higher etching rate for the first and second cladding layers than for the side-etching layer.

2. The method according to claim 1, wherein the first, second, and third cladding layers are formed of InP,
   the side-etching layer is formed of InGaAsP,
   the etchants used in the step of forming the overhang and in the second wet-etching step are an etchant containing sulfuric acid and hydrogen peroxide, and
   the etchants in the first and third wet-etching step are an etchant containing hydrogen bromide.

3. The method according to claim 2, wherein, in the first and third wet-etching steps, the first, second, and third cladding layers have side faces containing a (111) plane.

4. The method according to claim 1, wherein, in the step of selectively growing a second stacked semiconductor layer, the second stacked semiconductor layer further includes a semiconductor layer formed on the second cladding layer, the semiconductor layer having the same composition as the side-etching layer, and
   in the first wet-etching step, the wet etching for the third cladding layer is stopped when the side-etching layer and the semiconductor layer are exposed.

5. The method according to claim 1, wherein the step of forming a ridge structure further includes, before the step of etching the first stacked semiconductor layer, a step of etching the contact layer by dry etching.

* * * * *